(12) United States Patent
Sprague et al.

(10) Patent No.: US 11,372,144 B2
(45) Date of Patent: *Jun. 28, 2022

(54) NEAR INFRARED OPTICAL INTERFERENCE FILTERS WITH IMPROVED TRANSMISSION (71) Applicant: Materion Corporation, Mayfield Heights, OH (US)

(72) Inventors: Robert Sprague, Acton, MA (US); Shengyuan Bai, Shanghai (CN)

(73) Assignee: MATERION CORPORATION, Mayfield Heights, OH (US)

( * ) Notice: Subject to any disclaimer, the term of this patent is extended or adjusted under 35 U.S.C. 154(b) by 515 days.

This patent is subject to a terminal disclaimer.

(21) Appl. No.: 16/357,698

(22) Filed: Mar. 19, 2019

(65) Prior Publication Data

US 2019/0212484 A1 Jul. 11, 2019

Related U.S. Application Data (63) Continuation of application No. 15/046,889, filed on Feb. 18, 2016, now abandoned.
(Continued)

(51) Int. Cl.
*G02B 5/28* (2006.01)
*G02B 1/10* (2015.01)
(Continued)

(52) U.S. Cl.
CPC .............. *G02B 5/281* (2013.01); *C23C 14/06* (2013.01); *C23C 14/0652* (2013.01);
(Continued)

(58) Field of Classification Search
CPC .......... G02B 5/281; G02B 5/285; G02B 5/28; G02B 5/282; G02B 5/288; G02B 1/10;
(Continued)

(56) References Cited

U.S. PATENT DOCUMENTS 4,518,670 A 5/1985 Matsuzaki et al.
4,695,122 A 9/1987 Ishida
(Continued)

FOREIGN PATENT DOCUMENTS

CA 2879363 1/2014
CN 104280806 A 1/2015
(Continued)

OTHER PUBLICATIONS

MacLeod, H. Angus, Thin-Film Optical Filters, Fourth Edition, 2010, Chapters 4,5,7,8,11,14, Part I, Taylor and Francis Group LLC, Tuscon AZ.
(Continued)

*Primary Examiner* — Stephone B Allen
*Assistant Examiner* — Adam W Booher
(74) *Attorney, Agent, or Firm* — Tucker Ellis LLP (57) ABSTRACT An interference filter includes a layers stack comprising a plurality of layers of at least: layers of amorphous hydrogenated silicon with added nitrogen (a-Si:H,N) and layers of one or more dielectric materials, such as $SiO_2$, $SiO_x$, $SiO_xN_y$, a dielectric material with a higher refractive index in the range 1.9 to 2.7 inclusive, or so forth. The interference filter is designed to have a passband center wavelength in the range 750-1000 nm inclusive. Added nitrogen in the a-Si:H,N layers provides improved transmission in the passband without a large decrease in refractive index observed in a-Si:H with comparable transmission. Layers of a dielectric material with a higher refractive index in the range 1.9 to 2.7 inclusive provide a smaller angle shift compared with a similar interference filter using $SiO_2$ as the low index layers.

26 Claims, 4 Drawing Sheets

Related U.S. Application Data (60) Provisional application No. 62/117,598, filed on Feb. 18, 2015.

(51) Int. Cl.
   *C23C 14/14* (2006.01)
   *C23C 14/10* (2006.01)
   *C23C 14/06* (2006.01)
   *C23C 14/34* (2006.01)

(52) U.S. Cl.
   CPC ............. *C23C 14/10* (2013.01); *C23C 14/14* (2013.01); *C23C 14/3414* (2013.01); *C23C 14/3457* (2013.01); *G02B 1/10* (2013.01); *G02B 5/285* (2013.01)

(58) Field of Classification Search
   CPC ..... C23C 14/06; C23C 14/0652; C23C 14/10; C23C 14/14; C23C 14/3414; C23C 14/3457
   See application file for complete search history.

(56) References Cited

U.S. PATENT DOCUMENTS

| | | | |
|---|---|---|---|
| 5,398,133 A † | 3/1995 | Tsai | |
| 5,410,431 A | 4/1995 | Southwell | |
| 6,379,929 B1 * | 4/2002 | Burns | B01J 19/0093 435/91.1 |
| 6,572,975 B2 † | 6/2003 | Dalakos | |
| 7,123,416 B1 | 10/2006 | Erdogan et al. | |
| 7,242,152 B2 | 7/2007 | Dowling et al. | |
| 7,901,870 B1 | 3/2011 | Wach | |
| 9,989,684 B2 | 6/2018 | Sprague | |
| 2002/0080493 A1 | 6/2002 | Tsai | |
| 2002/0113243 A1 | 8/2002 | Kikawa et al. | |
| 2003/0039847 A1 | 2/2003 | Dalakos | |
| 2004/0008968 A1 | 1/2004 | Lee et al. | |
| 2004/0008969 A1 | 1/2004 | Lee et al. | |
| 2004/0234198 A1 | 11/2004 | Wagner et al. | |
| 2005/0099691 A1 | 5/2005 | Hendrix et al. | |
| 2007/0127126 A1 | 6/2007 | Terada | |
| 2008/0212849 A1 | 9/2008 | Gao | |
| 2009/0084438 A1 | 4/2009 | den Boer et al. | |
| 2009/0251759 A1 | 10/2009 | Domash et al. | |
| 2014/0014838 A1 † | 1/2014 | Hendrix | |
| 2014/0335330 A1 | 11/2014 | Bellman | |
| 2014/0377522 A1 | 12/2014 | Koch, III et al. | |
| 2016/0238759 A1 | 8/2016 | Sprague et al. | |

FOREIGN PATENT DOCUMENTS

| | | |
|---|---|---|
| CN | 104471449 | 3/2015 |
| JP | 2002223028 | 8/2002 |
| JP | 2003262720 | 9/2003 |
| JP | 2005501286 | 1/2005 |
| KR | 1020150031336 | 3/2015 |
| TW | 201411200 | 3/2014 |
| WO | WO 2011/129979 A2 | 10/2011 |
| WO | 2014014930 | 1/2014 |
| WO | WO 2014/065373 A1 | 5/2014 |

OTHER PUBLICATIONS

MacLeod, H. Angus, Thin-Film Optical Filters, Fourth Edition, 2010, Chapters 4,5,7,8,11,14, Part 2, Taylor and Francis Group LLC, Tuscon AZ.
MacLeod, H. Angus, Thin-Film Optical Filters Optical Filters, Fourth Edition, 2010, Chapters 4,5,7,8,11,14, Part 3, Taylor and Francis Group LLC, Tuscon AZ.
MacLeod, H. Angus, Thin-Film Optical Filters Fourth Edition, 2010, Chapters 4,5,7,8,11,14, Part 4, Taylor and Francis Group LLC, Tuscon AZ.
Tipler, Paul A., Maxwell's Equations and Electromagnetic Waves, Physics for Scientists and Engineers, 1991, 1982,1976, Chapters 29 & 30, Part 1, Third Edition, Worth Publishers, New York, NY.
Tipler, Paul A., Maxwell's Equations and Electromagnetic Waves, Physics for Scientists and Engineers, 1991, 1982,1976, Chapters 29 & 30, Third Edition, Worth Publishers, New York, NY.
Tipler, Paul A., Maxwell's Equations and Electromagnetic Waves, Physics for Scientists and Engineers, 1991, 1982,1976, Chapters 29 & 30, Part 3, Third Edition, Worth Publishers, New York, NY.
Tipler, Paul A., Maxwell's Equations and Electromagnetic Waves, Physics for Scientists and Engineers, 1991, 1982,1976, Chapters 29 & 30, Part 4, Third Edition, Worth Publishers, New York, NY.
Kochergin, Vladimir, Omnidirectional Optical Filters, 2003, First Edition, Part 1, Springer Science + Business Media, LLC, New York, NY.
Kochergin, Vladimir, Omnidirectional Optical Filters, 2003, First Edition, Part 2, Springer Science + Business Media, LLC, New York, NY.
Kochergin, Vladimir, Omnidirectional Optical Filters, 2003, First Edition, Part 3, Springer Science + Business Media, LLC, New York, NY.
Kochergin, Vladimir, Omnidirectional Optical Filters, 2003, First Edition, Part 4, Springer Science + Business Media, LLC, New York, NY.
Kochergin, Vladimir, Omnidirectional Optical Filters, 2003, First Edition, Part 5, Springer Science + Business Media, LLC, New York, NY.
Kochergin, Vladimir, Omnidirectional Optical Filters, 2003, First Edition, Part 6, Springer Science + Business Media, LLC, New York, NY.
Arrow Communication Laboratories, Inc., Magistrate Recommendations, May 16, 2008, Syracuse, NY.
*Arrow Communication Laboratories, Inc.* v. *John Mezzalingua Associates, Inc.*, Feb. 5, 2009, N.D., NY.
Reddy, Andra Naresh Kumar, Half-width at half-maximum, full-width at half-maximum analysis for resolution of asymmetrically apodized optic systems with slit apertures, Pramana Journal of Physics, Jan. 2015, pp. 117-126, vol. 84, No. 1, Indian Academy of Sciences, Hyderabad, India.
Teledyne Microwave Solutions, Filter Facts and Types, Feb. 2016, Mountain View, CA.
Willey, Ronald, R., Field Guide to Optical Thin Films, SPIE Field Guides, 1936, vol. FG07, SPIE—The International Society for Optical Engineering, Bellingham, Washington.
Baumeister, Philip W., Optical Coating Technology, 2004, SPIE—The International Society for Optical Engineering, Bellingham, Washington.
Seger, Kai, Compact solid-state lasers in the near-infrared and visible spectral range, 2013, Doctoral Thesis, Department of Applied Physics, KTH—Royal Institute of Technology, Stockholm, Sweden. Optics Balzers AG, NIR Bandpass Filters SP for 800-1100 nm, Liechtenstein, Germany.
Webster, A. Merriam, Webster's New Collegiate Dictionary, 1979, p. 72, G. & C. Merriam Company, Springfield, Massachusetts.
*Comcast Cable Communications, LLC* v. *Rovi Guides, Inc.*, PTAB IPR2017-0094, Paper No. 11.
*Necksgen Inc.* v. *Simpson Performance Products, Inc.*, PTAB IPR2018-00133, Paper No. 9.
*Securus Technologies, Inc.* v. *Global Tel\*Link Corporation*, PTAB IPR2016-00313, Paper No. 7.
Paselk, Richard A., Characterization of Macromolecules, Introduction to Spectrochemical Methods, Lab Lecture Notes, Sep. 4, 2008, Humboldt State University—Department of Chemistry, Arcata, California.
Publication entitled "Silicon Nitride Arc Thin Films by New Plasma Enhanced Chemical Vapor Deposition Source Technology" by George et al., at the Photovoltaic Specialists Conference, 2008, 33$^{rd}$ IEEE, pp. 1-5.
Wikipedia entry "Inert Gas", published Aug. 20, 2012.
Debieu et al.; Structural and optical characterization of pure Si-rich nitride thin films; Nanoscale Research Letters; vol. 8; No. 31; pp. 1-13; 2013.

(56) References Cited

OTHER PUBLICATIONS

Domash et al.; Tunable and Switchable Multiple-Cavity Thin Film Filters; Journal of Lightwave Technology; vol. 22; No. 1; pp. 126-135; 2004.
Machorro et al.; Modification of refractive index in silicon oxynitride films during deposition; Materials Letters; vol. 45; pp. 47-50; 2000.
Search Report from EP Patent Application No. 16708041.5 dated Mar. 26, 2019.
Extended European Search Report—EP 21156083—dated Jul. 20, 2021—16 pages.
George et al., Silicon Nitride Arc Thin Films by New Plasma Enhanced Chemical Vapor Deposition Source Technology, Photovoltaic Specialists Conference, 2008, 33rd IEEE, pp. 1-5.†

\* cited by examiner
† cited by third party

NEAR INFRARED OPTICAL INTERFERENCE FILTERS WITH IMPROVED TRANSMISSION

This application is a continuation of U.S. patent application Ser. No. 15/046,889, filed Feb. 18, 2016, which claims the benefit of U.S. Provisional Application No. 62/117,598 filed Feb. 18, 2015 and titled "NEAR INFRARED OPTICAL INTERFERENCE FILTERS WITH IMPROVED TRANSMISSION". U.S. Provisional Application No. 62/117,598 filed Feb. 18, 2015 is incorporated herein by reference in its entirety.

BACKGROUND

The following relates to the optical arts, optical filter arts, and related arts.

A known transmission interference filter employs a stack of alternating silicon and silicon dioxide ($SiO_2$) layers. Such devices are known for use in the short wave and mid wave infrared down to about 1100 nm, as both silicon and $SiO_2$ are transparent in this range. The lower wavelength threshold (corresponding to the upper photon energy threshold) is controlled by the onset of absorption by the silicon, which in its crystalline form has a bandgap of about 1.12 eV. A key advantage of silicon in these devices is its high refractive index. The spectral profile of an optical interference filter is, among other things, dependent on the angle of illumination. As the angles increase the filters shift to shorter wavelength. This angular shift is dependent on the materials used and the distribution of those materials. Higher refractive index results in less angle shift. For narrow band filters the amount of angle shift limits the useful bandwidth of the filter when used in optical systems. In systems with large angular acceptance angles a filter constructed such as to yield low angular shift can have a narrower passband and hence greater noise rejection than one constructed of materials with lower refractive index.

To extend device operation into the near infrared, it is further known to hydrogenate the silicon, so as to employ alternating layers of hydrogenated amorphous silicon (a-Si:H) and $SiO_2$. By hydrogenating the silicon, the material loss and refractive index are reduced. By this approach, very high performance interference filters operating in the 800-1000 nm range are achievable.

Some improvements are disclosed herein.

BRIEF SUMMARY

In one illustrative aspect disclosed herein, an interference filter is disclosed, including a layers stack comprising plurality of layers of at least: layers of amorphous hydrogenated silicon with added nitrogen (a-Si:H,N) and layers of one or more dielectric materials having a refractive index lower than the refractive index of the a-Si:H,N. The one or more dielectric materials may include, by way of non-limiting example, $SiO_2$, silicon suboxide ($SiO_x$), and/or silicon oxynitride ($SiO_xN_y$). In some embodiments, the one or more dielectric materials include layers of a dielectric material having a refractive index in the range 1.9 to 2.7 inclusive. In some embodiments the a-Si:H,N has an atomic concentration between 1% and 4% hydrogen and between 2% and 6% nitrogen. The layers stack may be supported by a transparent substrate, such as a glass substrate.

In another illustrative aspect disclosed herein, an interference filter includes a layers stack comprising alternating a-Si:H,N and silicon based dielectric layers, in which the interference filter has at least one passband with center wavelength in the range 750 1100 nm inclusive, or more preferably in the range 800-1100 nm inclusive. The silicon based dielectric layers may comprise, by way of non-limiting example, silicon oxide ($SiO_x$) layers and/or silicon oxynitride ($SiO_xN_y$) layers. In some embodiments the a-Si:H,N has an atomic concentration between 4% and 8% hydrogen and between 2% and 12% nitrogen. The layers stack may be supported by a transparent substrate, such as a glass substrate.

In another illustrative aspect disclosed herein, a method of manufacturing an interference filter comprising alternating a-Si:H,N and $SiO_x$ layers is disclosed. The method comprises sputtering silicon from a silicon target onto a filter substrate and, during the sputtering, alternating between (i) a process gas including hydrogen and nitrogen in order to deposit a Si:H,N and (ii) a process gas including oxygen in order to deposit $SiO_x$. The sputtering may comprise applying a negative bias to the silicon target, and including an inert gas component in both the process gas including hydrogen and nitrogen and the process gas including oxygen. The inert gas may, for example, be argon. Also disclosed are interference filters manufactured by this process.

In another illustrative aspect disclosed herein, an interference filter includes a layers stack comprising plurality of layers of at least layers of amorphous hydrogenated silicon and layers of one or more dielectric materials having a refractive index lower than the refractive index of the amorphous hydrogenated silicon, including layers of a dielectric material having a refractive index in the range 1.9 to 2.7 inclusive. In some embodiments, the layers of a dielectric material having a refractive index in the range 1.9 to 2.7 inclusive include one or more layers comprising $Si_3N_4$, $SiO_xN_y$ with y large enough to provide a refractive index of 1.9 or higher, $Ta_2O_5$, $Nb_2O_5$, or $TiO_2$. In some embodiments the layers stack includes at least one $SiO_2$ layer immediately adjacent a layer of a dielectric material having a refractive index in the range 1.9 to 2.7 inclusive with no intervening layer of amorphous hydrogenated silicon. In some embodiments the amorphous hydrogenated silicon includes nitrogen. In some such embodiments the amorphous hydrogenated silicon including nitrogen has an atomic concentration between 1% and 4% hydrogen and between 2% and 6% nitrogen.

DETAILED DESCRIPTION

Figure 2:
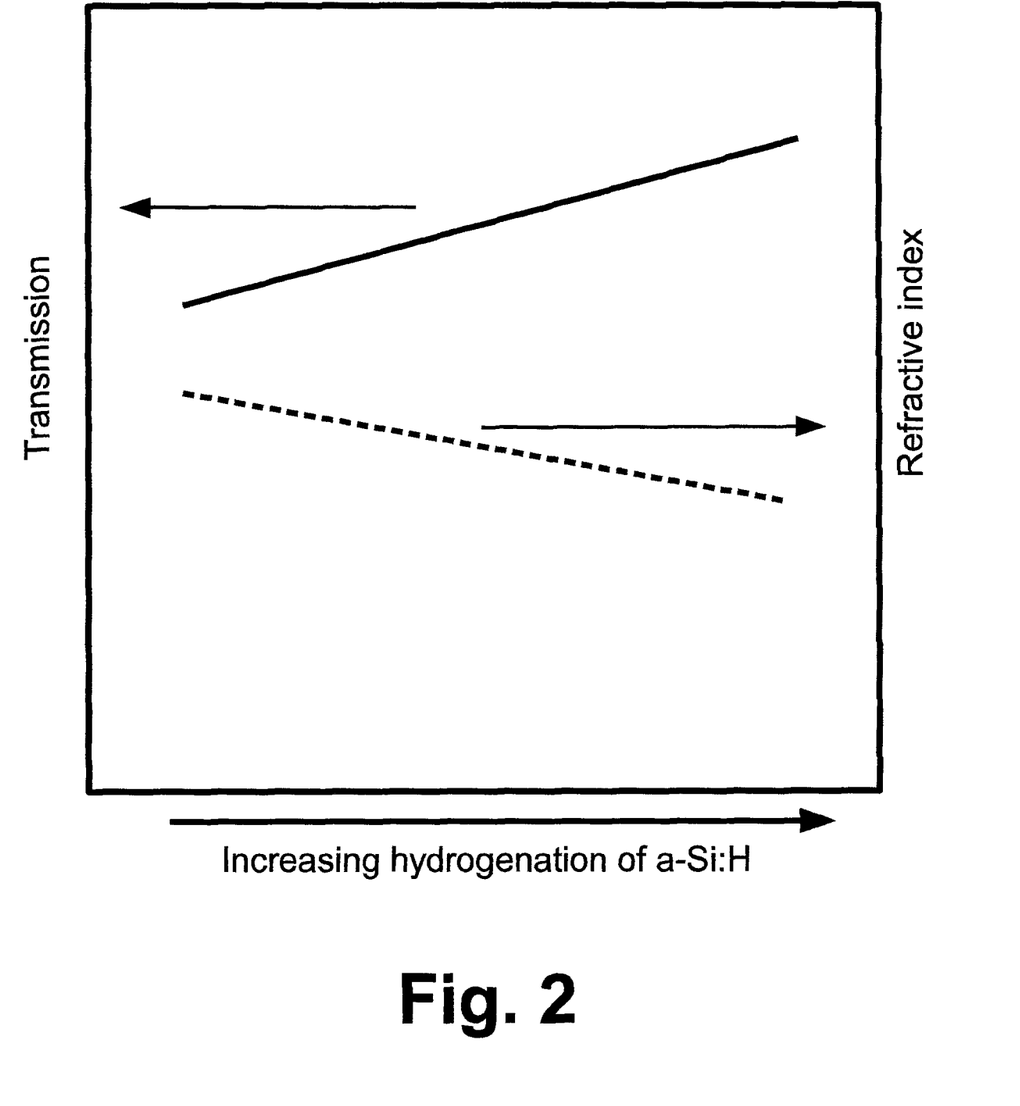
FIG. 2 diagrammatically shows the impact of hydrogenation on the optical properties (transmission and refractive index) of amorphous hydrogenated silicon (a-Si:H).

As previously noted, an interference filter comprising a stack of layer units with hydrogenated silicon (a-Si:H) layers is used for operation in the near infrared (800-1250 nm), because the hydrogenation of the silicon decreases the absorption losses (both from intrinsic silicon and disorder induced) sufficiently to provide acceptable filter transmission characteristics in the passband. With brief reference to FIG. 2, it is recognized herein that this approach for the near-infrared has a substantial disadvantage. As seen in diagrammatic FIG. 2, for a fixed wavelength in the infrared (e.g. in the range 800-1100 nm), increasing hydrogenation of the a-Si:H (that is to say, increasing the hydrogen content of the a-Si:H) does decrease the loss—however it also decreases the refractive index of the a-Si:H as diagrammatically depicted in FIG. 2.

The performance of narrow band interference filters for high numerical aperture optical systems is a compromise between obtaining high transmission with the low angle shift in the near infrared region where the material characteristics are changing rapidly. High transmission corresponds to low extinction coefficient (obtainable with high amounts of hydrogen) while small angle shift is achieved by high refractive index (obtainable with small amounts of hydrogen).

Figure 3:
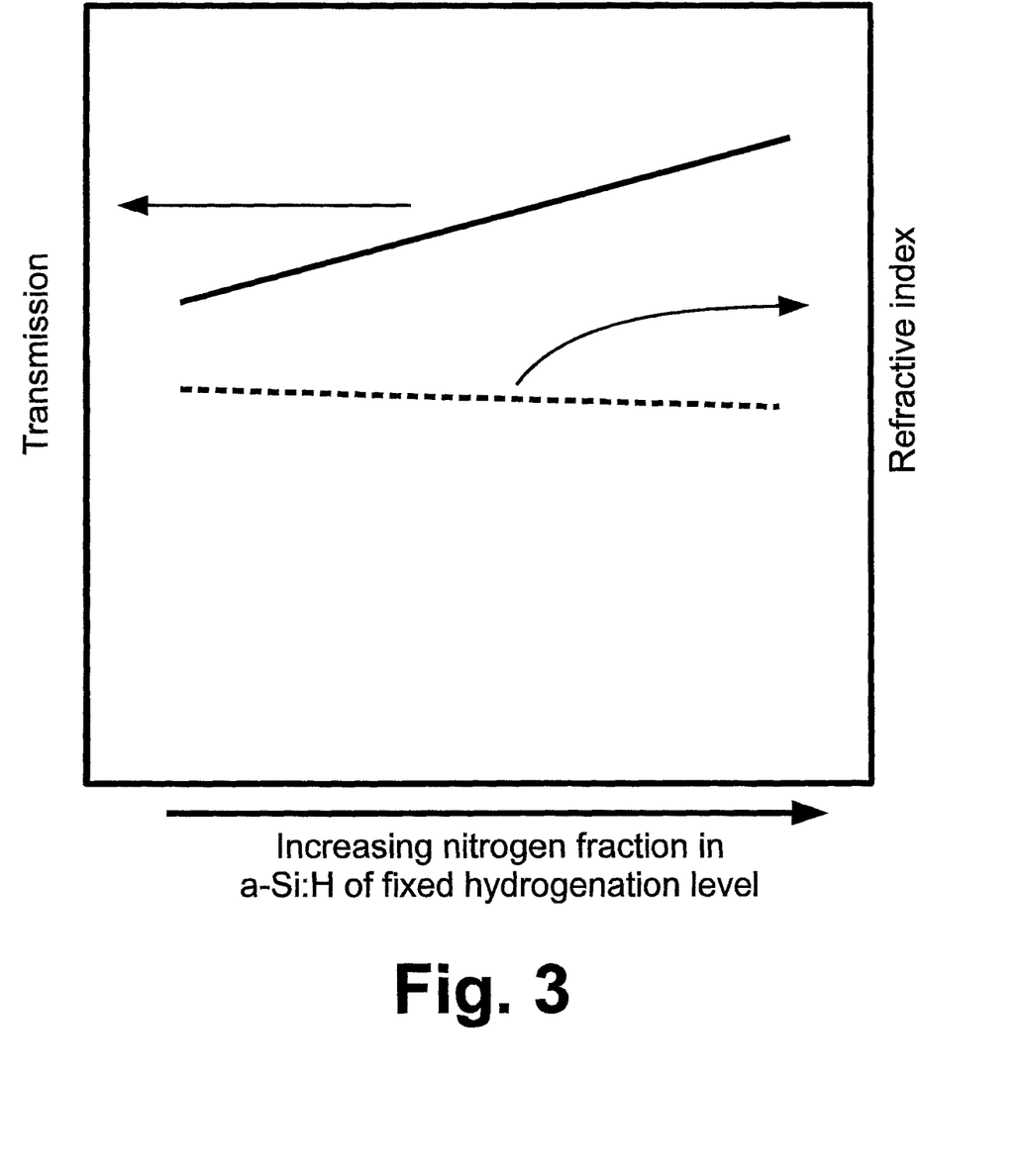
FIG. 3 diagrammatically shows the impact of nitrogen additive on the optical properties (transmission and refractive index) of a-Si:H of fixed hydrogenation level.

With brief reference to FIG. 3, the disclosed improvement pertains to adding a controlled amount of nitrogen to the a-Si:H layers of Si-based interference filters for use in the near-infrared (800-1100 nm). Said another way, this improvement entails substituting a-Si:H,N for a-Si:H. As diagrammatically shown in FIG. 3, for a fixed wavelength in the infrared (e.g. in the range 800-1100 nm), and for a given (fixed) level of hydrogenation, adding nitrogen increases the transmission with a reduced concomitant reduction in refractive index. The impact of adding nitrogen on the refractive index is much less than the impact of hydrogenation, especially for nitrogen fractions in the range of 10% nitrogen or lower. Accordingly, this modification enables fabrication of near-infrared interference filters operating in the range 800-1100 nm with improved control of the angular shift, peak transmission and filter bandwidth.

On the other hand, for a given passband width, substituting a-Si:H,N for a-Si:H can provide improved transmission in the passband. In this approach, substituting a-Si:H,N for a-Si:H enables fabrication of near-infrared interference filters with improved transmission in the passband as compared with equivalent a-Si:H-based device having the same refractive index step (and hence the same spectral passband width). Indeed, the inventors have found that in this design paradigm the practical operational range of such filters can be extended down to 750 nm.

The skilled artisan will recognize that the spectral range encompassed by the disclosed a-Si:H,N based interference filters encompasses passbands of technological importance, such as the 850 nm optical data communications window.

In some interference filters applications operating in this range, another consideration is the angle shift of the passband. Conceptually, the angular shift results from the light ray path length through a layer increasing with increasing angular deviation away from normal incidence. This increase in path length corresponds to a change in the phase retardation, which affects constructive/destructive interference so as to introduce the angle shift. If the normal incidence path length through a layer is $d_L$, then the path length though the layer at an angle $\theta_L$ in the material (measured off the normal, i.e. $\theta_L=0$ for normal incidence) is $d_L'=d_L/\cos(\theta_L)$. As $\theta_L$ is related to the angle-of-incidence $\theta$ of light impinging upon the interference filter according to Snell's law, and assuming the ambient is air (n=1), this leads to $\theta_L=\arcsin(\theta/n_L)$ where $n_L$ is the refractive index of the layer. Using the identity $\cos(u)=\sqrt{1-(\sin(u))^2}$ enables this to be written as $$d_L' = d_L \bigg/ \sqrt{1-\left(\frac{\theta}{n_L}\right)^2}.$$

It is thus seen that the angular shift effect is made worse by a small refractive index $n_L$ of the layer.

In conventional interference filter design, it is typically desired to maximize the refractive index contrast between the high index layers and the low index layers. In silicon-based interference filters, the high refractive index layers are a-Si:H (which could be replaced by a-Si:H,N as disclosed herein) while silicon dioxide ($SiO_2$ having n~1.4-1.5) serves as the low refractive index layers. However, it is disclosed herein to obtain reduced angular shift in interference filters operating in the 750-1000 nm range by substituting a higher refractive index material for $SiO_2$ in some or all low index layers of the interference filter. In some contemplated embodiments, the substitute layer is a dielectric layer that has a refractive index in the range 1.9 to 2.7 inclusive. Some suitable Si-compatible materials providing these values include silicon nitride ($Si_3N_4$ having n~2.0-2.2), silicon oxynitride ($SiO_xN_y$ with y large enough to provide a refractive index of 1.9 or higher), tantalum pentoxide ($Ta_2O_5$ having n~2.1-2.2), niobium pentoxide ($Nb_2O_5$ having n~2.3-2.4), or titanium dioxide ($TiO_2$ having n~2.6). In illustrative embodiments shown herein, silicon nitride ($Si_3N_4$) is used. The high index a-Si:H or a-Si:H,N layer should have hydrogen (and optionally nitrogen) content sufficient to provide the desired refractive index contrast with the low index layers.

Moreover, to obtain a desired low angle shift for a design-specification angle it may be sufficient to replace only some $SiO_2$ layers of the stack with the higher index dielectric material (e.g. $Si_3N_4$). Optical design software (e.g. a ray tracing simulator) can be used to optimize layer placement and thicknesses for materials with known refractive index in order to achieve desired center band, bandwidth, and angle shift design basis characteristics.

Figure 1:
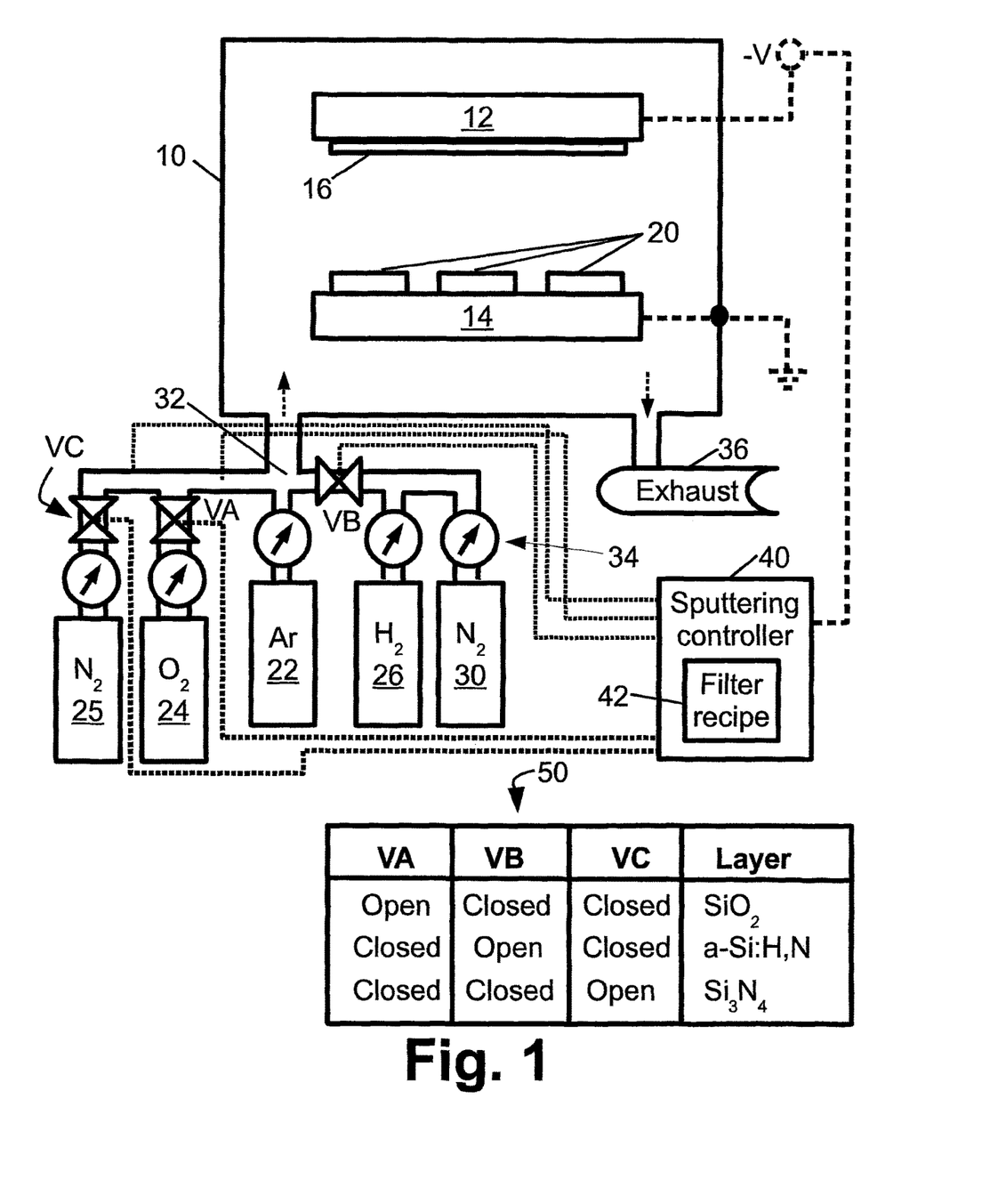
FIG. 1 diagrammatically shows a sputter deposition system for fabricating near infrared optical interference filters with improved transmission and/or reduced angular shift as disclosed herein.

With reference now to FIG. 1, a suitable manufacturing system is described. The illustrative system employs sputter deposition—however, other deposition methods are contemplated, such as vacuum evaporation, electron-beam evaporation, or so forth. In general, either a.c. or d.c. sputtering may be used. The illustrative sputter deposition system includes a process chamber 10 containing a sputter target holder 12 and a substrate carousel 14. For the illustrative deposition, a silicon target 16 (e.g. silicon wafer 16) is mounted in the sputter target holder 12. One or more substrates 20 are loaded into the substrate carousel 14. The substrate(s) 20 are suitably of a material, such as glass, silica, or alumina, that is transparent in the wavelength range of interest (e.g. 800-1000 nm, or 750-1000 nm).

In sputter deposition, energetic particles are directed toward the target 16 (in this case a silicon target 16), which particles have sufficient energy to remove (i.e. "sputter") material off the target, which then transfers (ballistically and/or under the influence of a magnetic or electric field) to the surface of the substrate(s) 20 so as to coat the substrates 20 with the sputtered material. The illustrative sputter deposition system employs argon (Ar) gas from an illustrative Ar gas bottle 22 or from another argon source as the energetic particles. An ionizing electric field generated by applying a negative bias (−V) to the target 16 in order to ionize argon atoms which then bombard the negatively biased target 16 under influence of the electric field generated by the −V voltage bias in order to produce the sputtering. The substrate(s) 20, on the other hand, are biased more positively as compared with the target 16, e.g. the substrate(s) 20 are grounded in the illustrative sputter system of FIG. 1. In this illustrative configuration, the target 16 is the cathode, and the chamber 10 (and/or the substrate(s) 20, e.g. in some embodiments the substrate carousel 14 may be grounded) is the anode, of an electric circuit. While argon is the sputtering gas in the illustrative embodiment, other inert gases that can be ionized could be alternatively used, such as xenon.

To deposit silicon dioxide, an oxygen ($O_2$) bottle 24 or other oxygen source is provided. To deposit amorphous hydrogenated silicon with nitrogen additive (a-Si:H,N), a hydrogen ($H_2$) bottle 26 or other hydrogen source (for example, ammonia, $NH_4$, or silane, $SiH_4$) and a nitrogen ($N_2$) bottle 30 or other nitrogen source are provided. A (diagrammatically indicated) gas inlet manifold 32 is provided in order to admit a desired gas mixture into the process chamber 10 during the sputter deposition process. Flow regulators 34 are adjustable to set the flow of Ar, $O_2$, $H_2$, and $N_2$, respectively. The process chamber 10 is also connected with a suitable exhaust 36 (e.g. with scrubbers or the like) to discharge gas from the chamber 10. It is contemplated to substitute other gas sources for the illustrative $O_2$, $H_2$, and $N_2$ bottles. Other suitable nitrogen gas sources include ammonia ($NH_4$) or hydrazine ($N_2H_4$). When using a gas source such as ammonia or hydrazine which includes both nitrogen and hydrogen, calibrations should be performed to account for the relative incorporation of nitrogen and hydrogen into the a-Si:H,N layer. Process parameters such as substrate temperature, target bias (−V), process chamber pressure, total flow rate, and so forth may impact relative incorporate of nitrogen versus hydrogen. Two valves VA, VB are provided to switch between depositing $SiO_2$ and a-Si:H,N. The valve VA controls admission of oxygen from the oxygen source 24 into the gas inlet manifold 32, while the valve VB controls admission of the hydrogen/nitrogen mixture from the hydrogen and nitrogen sources 26, 30. To enable rapid switching between $SiO_2$ deposition and a-Si:H,N deposition, the valves VA, VB are automated valves whose actuators are controlled by an electronic sputtering controller 40 in accordance with a filter recipe 42. For example, the sputtering controller 40 may comprise digital-to-analog (D/A) converters, a high voltage source, and a microprocessor or microcontroller programmed to operate the D/A converters generate electrical actuation signals to open or close respective valves VA, VB in accordance with the filter recipe 42 and to operate the voltage source to apply the voltage −V to the target/cathode 16. A lower right-hand inset table 50 shown in FIG. 1 summarizes the settings for valves VA, VB to deposit $SiO_2$ and a-Si:H,N, respectively. To deposit $SiO_2$ the valve VA is open to admit oxygen to the gas inlet manifold 32 while the valve VB is closed to turn off the hydrogen and nitrogen sources. The resulting process gas is an argon/oxygen mixture. To deposit a-Si:H,N the valve VA is closed to block the oxygen and the valve VB is opened to admit process gas comprising an argon/hydrogen/nitrogen mixture to the gas inlet manifold 32. Note that the argon source 22 is connected to the gas inlet manifold 32 independently from the valves VA, VB. Separate manually operable shut-off valves (not shown) are typically provided for each gas source 22, 24, 26, 30 to enable manual shut-off of each gas source independently from the automatic valves VA, VB.

If it is further desired to substitute a higher refractive index material for some of the low index layers, additional gas sources may be provided along with suitable valving. In the illustrative system of FIG. 1, an additional nitrogen ($N_2$) bottle 25 or other nitrogen source are provided, controlled by a valve VC, in order to deposit silicon nitride ($Si_3N_4$) layers. As further indicated in the table 50, deposition of $Si_3N_4$ is obtained when valve VC is open and both valves VA and VB are closed. As with deposition of $SiO_2$, the silicon component of the silicon nitride is supplied by the silicon-based sputtering target 20. The desired stoichiometry is set by the flow regulator on the nitrogen bottle 25 using suitable calibration runs. Although not shown in FIG. 1, it will be appreciated that a similar setup could be used to deposit $SiO_xN_y$ with refractive index of 1.9 or higher, by opening both valves VA, VC with valve VB closed. To substitute a dielectric layer that does not contain silicon (e.g. $Ta_2O_5$, $Nb_2O_5$, or $TiO_2$), the target holder 12 may have multiple target slots which are loaded with a silicon target and also another slot loaded with a suitable target containing, e.g., tantalum, niobium, or titanium, for use in depositing the non-silicon containing dielectric layers. Alternatively, the tantalum, niobium, titanium, et cetera may be provided by a gas source or other source.

An illustrative interference filter fabrication process suitably performed using the fabrication system of FIG. 1 is described next. Initially, all gas sources 22, 24, 26, 30 are manually closed off, the process chamber 10 is brought to atmospheric pressure and opened, the target 16 is loaded onto the target holder 12, and the substrate(s) 20 are loaded onto the substrate carousel 14. The process chamber 10 is then closed and drawn down to a target vacuum level. As further setup, the flow regulators 34 are manually set to the desired flow rates. (Alternatively, it is contemplated for the flow regulators to be under automatic control of the sputtering controller 40, in which case the regulators are suitably set in accordance with values provided in the filter recipe).

Sputter deposition is initiated by flowing the appropriate process gas via the gas inlet manifold 32 and applying the cathode bias −V to the target 16 in order to ionize Ar atoms which are driven by the electric field to sputter silicon off the silicon target 16. The particular startup sequence depends upon the particular sputter deposition system and other design considerations: for example, in one approach the process gas flow is first initiated and then the cathode bias −V is applied to initiate sputter deposition; alternatively, the bias can be applied under an inert gas flow and sputter deposition initiated by admitting the appropriate process gas.

During sputtering, valves VA and VB (and optionally VC) are opened and closed in accord with the filter recipe 42 and the valve settings of table 50 in order to alternate between depositing $SiO_2$ (and/or optionally $Si_3N_4$) and a-Si:H,N layers. The layer thicknesses are controlled based on deposition time and a priori knowledge of deposition rates obtained from calibration depositions. Layer compositions are determined based on the process gas mixture controlled by the settings of the flow regulators 34 which are set based on calibration depositions (such calibration deposition should also include process parameters such as substrate temperature, target bias (−V), chamber pressure, and total flow rate in the calibration test matrix, as such parameters may also impact layer composition). After deposition of the stack of interference filter layers is completed, process gas flow and the bias voltage −V are removed (again, the particular shutdown sequence depends upon the particular deposition system and so forth), the process chamber 10 is brought up to atmospheric pressure, opened, and the coated substrates 20 are unloaded.

Figure 4:
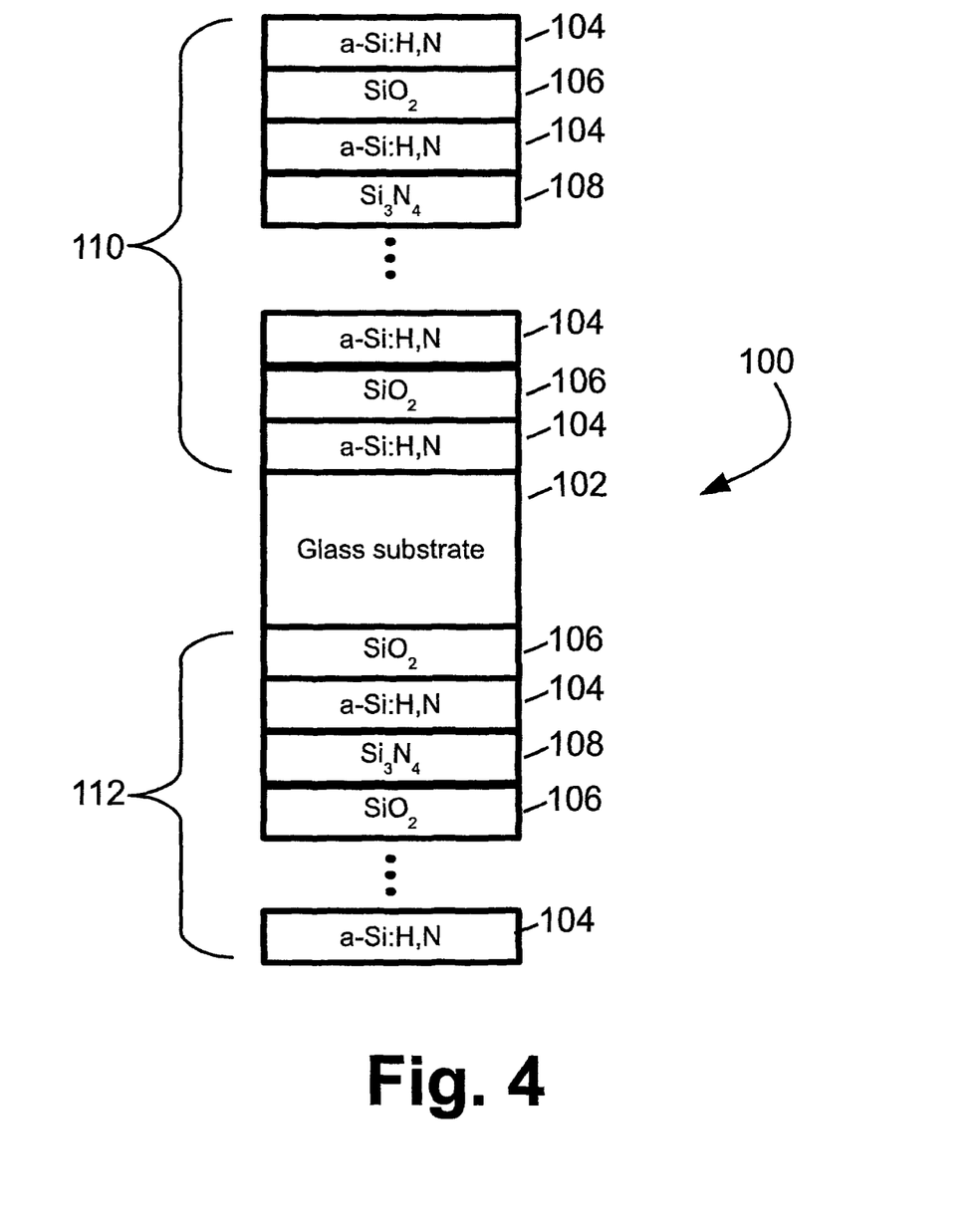
FIG. 4 diagrammatically shows an interference filter suitably manufactured using the sputter deposition system of FIG. 1.

With reference to FIG. 4, a diagrammatic representation of a thusly fabricated interference filter 100 is shown. The filter includes the substrate 102 (e.g. the glass, silica, or alumina substrate initially loaded onto the substrate carousel 14) and alternating layers of a-Si:H,N 104 and $SiO_2$ 106 and/or $Si_3N_4$ 108. In the illustrative interference filter 100 the layer immediately adjacent the substrate 102 is an a-Si:H,N layer 104, but in other embodiments a dielectric layer may be immediately adjacent the substrate. In the illustrative interference filter 100 the topmost layer is an a-Si:H,N layer 104, but in other embodiments a dielectric layer may be the topmost layer. The illustrative stack includes an instance of immediately adjacent $SiO_2/Si_3N_4$ layers, which may be included if in accord with the design. The illustrative interference filter 100 includes layer stacks 110, 112 on opposite sides of the substrate 102—to manufacture such a device, the sputtering chamber may need to be opened and the substrates "flipped over" on the substrate carousel 14. (Alternatively, the substrate carousel 14 may be configured to enable such a maneuver to be performed robotically without breaking open the chamber). Such a filter with two filter sides 110, 112 may, for example, be a passband filter in which the stack on one side is a high-pass filter and the stack on the other side is a low-pass filter—a passband is then defined by a wavelength range that is both above the high pass filter cut-off and below the low-pass filter cutoff.

A known application of this kind of filter is in applications using silicon detectors. These wavelengths are particularly useful in active devices, in which a light source as well as a detector are present. In this spectral region, LEDs and lasers are readily available which are inexpensive, plentiful and efficient. Some major applications include, but are not limited to, infrared gesture controls of human-machine (e.g. computer) interaction, infrared night vision for automobiles, LIDAR, infrared night vision for security cameras and proximity CMOS sensors used in mobile phone and elsewhere. In these applications the useful wavelength is between 700 and 1100 nm. In this range the a-Si:H,N is a high index material suitable for optical applications. The typical index in this range is 3.3~3.5, whereas by comparison $TiO_2$ has refractive index of only about 2.3~2.4. In some suitable embodiments, the a-Si:H,N layers includes between 2% and 8% hydrogen and between 3%-7% nitrogen with the balance being Si. In general, more hydrogen and nitrogen contents provide shorter wavelength operation. In general, nitrogen concentrations as high as 6% to 12% are contemplated.

In the illustrative embodiments, the a-Si:H,N layers 104 alternate with $SiO_2$ layers 106. $SiO_2$ has advantageous properties for this purpose, including good chemical compatibility with a-Si:H,N and a low refractive index (n~1.5) which provides a large refractive index step at the interface with a-Si:H,N. However, it is contemplated to substitute another dielectric layer for the $SiO_2$ layer. For example, the dielectric may not have exact $SiO_2$ stoichiometry, e.g. the $SiO_2$ may be replaced by $SiO_x$ where x is not precisely two (also referred to herein as "silicon suboxide").

As another example, a silicon oxynitride ($SiO_xN_y$) layer is contemplated as the dielectric layer in place of $SiO_2$. In general, when adding nitrogen to go from $SiO_x$ to $SiO_xN_y$ the refractive index of increases with nitrogen content: for example, stoichiometric silicon nitride ($Si_3N_4$) has a refractive index of about 2.0. However, a small amount of nitrogen (that is, $SiO_xN_y$ where x~2 and x>>y) is contemplated to improve interface quality between the a-Si:H,N layer 104 and the adjacent dielectric layer. These compounds offer index tailoring that permit the construction of novel material combinations and continuously varying refractive index profiles.

Some suitable design methods for designing the constituent layer thicknesses the given refractive indices of the constituent layers are based on the following. In general, the wavelength λ in the layer is given by $\lambda=\lambda_0/n$ where $\lambda_0$ is the free space wavelength and n is the refractive index. Reflection from a surface of higher refractive index introduces a 180° phase shift, while no phase shift is introduced by reflection from a surface of lower refractive index. Using these principles and given the refractive indices of the constituent layers, the thicknesses of the constituent layers are chosen such that, for the design-basis passband center wavelength, the optical path lengths through each layer and reflected at its interface with the next layer constructively combine, that is, are integer multiples of the wavelength. More elaborate interference filter design techniques for choosing the constituent layer thicknesses (and refractive indices if these are also optimized parameters) are given in: H. Angus Macleod, THIN-FILM OPTICAL FILTERS, FOURTH EDITION (Series in Optics and Optoelectronics, CRC Press 2010).

While the illustrative interference filters include repeating units of two layers, it is contemplated to incorporate three or more layers into the repeating unit, such as an a-Si:H,N layer and two different dielectric layers, to achieve desired passband properties (e.g. center wavelength, FWHM, "flatness" of the passband, et cetera).

It will be appreciated that various of the above-disclosed and other features and functions, or alternatives thereof, may be desirably combined into many other different systems or applications. It will be further appreciated that various presently unforeseen or unanticipated alternatives, modifications, variations or improvements therein may be subsequently made by those skilled in the art which are also intended to be encompassed by the following claims.

The invention claimed is:

1. An interference filter comprising:
   a layers stack comprising a plurality of layers of at least:
   layers of amorphous hydrogenated silicon with added nitrogen (a-Si:H,N), the a-Si:H,N layers having a refractive index in the range 3.3 to 3.5 inclusive, wherein the a-Si:H,N has an atomic concentration of hydrogen between 1% and 4% and an atomic concentration of nitrogen between 2% and 6%; and
   layers of one or more dielectric materials having a refractive index lower than the refractive index of the a-Si:H,N, wherein the layers of one or more dielectric materials include layers of a dielectric material having a refractive index in the range 1.9 to 2.7 inclusive;
   wherein the layers stack includes repeating units of two or more layers.

2. The interference filter of claim 1 wherein the one or more dielectric materials include $SiO_2$.

3. The interference filter of claim 1 wherein the one or more dielectric materials include a silicon suboxide ($SiO_x$).

4. The interference filter of claim 1 wherein the one or more dielectric layers include a silicon oxynitride ($SiO_xN_y$).

5. The interference filter of claim 1 wherein the layers of a dielectric material having a refractive index in the range 1.9 to 2.7 inclusive include one or more layers comprising $Si_3N_4$, $SiO_xN_y$ with y large enough to provide a refractive index of 1.9 or higher, $Ta_2O_5$, $Nb_2O_5$, or $TiO_2$.

6. The interference filter of claim 5 wherein the layers of one or more dielectric materials further include $SiO_2$ layers, wherein the layers stack includes at least one $SiO_2$ layer immediately adjacent a layer of a dielectric material having a refractive index in the range 1.9 to 2.7 inclusive with no intervening layer of amorphous hydrogenated silicon.

7. The interference filter of claim 1 wherein the layers stack is configured to have a passband center wavelength in the range 800-1100 nm inclusive.

8. The interference filter of claim 1 wherein the layers stack is configured to have a passband center wavelength in the range 750-1100 nm inclusive.

9. The interference filter of claim 1 further comprising: a transparent substrate supporting the layers stack.

10. The interference filter of claim 9 wherein the transparent substrate comprises a glass substrate.

11. The interference filter of claim 9 wherein the layers stack includes a first layers stack on one side of the transparent substrate and a second layers stack on the opposite side of the transparent substrate.

12. The interference filter of claim 11 wherein the first layers defines a low pass filter with a low pass cutoff wavelength, the second layers stack defines a high pass filter with a high pass cutoff wavelength, and the interference filter has a passband defined between the high pass cutoff wavelength and the low pass cutoff wavelength.

13. An interference filter comprising:
a layers stack comprising alternating a-Si:H,N and silicon based dielectric layers;
wherein the a-Si:H,N layers have a refractive index in the range 3.3 to 3.5 inclusive, the a-Si:H,N layers have an atomic concentration of hydrogen between 4% and 8% and an atomic concentration of nitrogen between 2% and 12%;
wherein the silicon based dielectric layers have a refractive index lower than the refractive index of the a-Si:H,N;
wherein the interference filter is configured to have a passband wavelength range of 750-1100 nm inclusive.

14. The interference filter of claim 13 configured to have a passband wavelength range of 800-1100 nm inclusive.

15. The interference filter of claim 13 wherein the passband center wavelength is 850 nm.

16. The interference filter of claim 13 wherein the silicon based dielectric layers comprise silicon oxide ($SiO_x$) layers.

17. The interference filter of claim 16 wherein the silicon oxide ($SiO_x$) layers comprise stoichiometric $SiO_2$ layers.

18. The interference filter of claim 13 wherein the silicon based dielectric layers comprise silicon oxynitride ($SiO_xN_y$) layers.

19. The interference filter of claim 13 further comprising: a transparent substrate supporting the layers stack.

20. The interference filter of claim 19 wherein the transparent substrate comprises a glass substrate.

21. An interference filter comprising:
a layers stack comprising a plurality of layers of at least:
layers of amorphous hydrogenated silicon with added nitrogen (a-Si:H,N), the a-Si:H,N layers having a refractive index in the range 3.3 to 3.5 inclusive, wherein the a-Si:H,N has an atomic concentration of hydrogen between 2% and 8% and an atomic concentration of nitrogen between 3% and 7%; and
layers of one or more dielectric materials having a refractive index lower than the refractive index of the amorphous hydrogenated silicon including layers of a dielectric material having a refractive index in the range 1.9 to 2.7 inclusive;
wherein the layers of one or more dielectric materials further include $SiO_2$ layers, and
wherein the layers stack includes at least one $SiO_2$ layer immediately adjacent a layer of a dielectric material having a refractive index in the range 1.9 to 2.7 inclusive with no intervening layer of a-Si:H,N.

22. The interference filter of claim 21 wherein the layers of a dielectric material having a refractive index in the range 1.9 to 2.7 inclusive include one or more layers comprising $Si_3N_4$, $SiO_xN_y$ with y large enough to provide a refractive index of 1.9 or higher, $Ta_2O_5$, $Nb_2O_5$, or $TiO_2$.

23. The interference filter of claim 21 wherein the interference filter is configured to have a passband wavelength range of 750-1100 nm inclusive.

24. The interference filter of claim 21 further comprising: a transparent substrate supporting the layers stack.

25. The interference filter of claim 24 wherein the layers stack includes a first layers stack on one side of the transparent substrate and a second layers stack on the opposite side of the transparent substrate.

26. The interference filter of claim 25 wherein the first layers defines a low pass filter with a low pass cutoff wavelength, the second layers stack defines a high pass filter with a high pass cutoff wavelength, and the interference filter has a passband defined between the high pass cutoff wavelength and the low pass cutoff wavelength.

* * * * *